(12) United States Patent
Kuo

(10) Patent No.: US 7,280,423 B1
(45) Date of Patent: Oct. 9, 2007

(54) CURRENT-MODE SENSING STRUCTURE OF HIGH-DENSITY MULTIPLE-PORT REGISTER IN EMBEDDED FLASH MEMORY PROCEDURE AND METHOD FOR THE SAME

(75) Inventor: Jew-Yong Kuo, Shanghai (CN)

(73) Assignee: Grace Semiconductor Manufacturing Corporation, Shanghai (CN)

( * ) Notice: Subject to any disclaimer, the term of this patent is extended or adjusted under 35 U.S.C. 154(b) by 0 days.

(21) Appl. No.: 11/443,036

(22) Filed: May 31, 2006

(51) Int. Cl.
*G11C 7/02* (2006.01)
*G11C 16/06* (2006.01)

(52) U.S. Cl. ............ 365/208; 365/185.2; 365/185.21; 365/210

(58) Field of Classification Search ............ 365/208
See application file for complete search history.

(56) References Cited

U.S. PATENT DOCUMENTS

| | | | | |
|---|---|---|---|---|
| 5,189,640 A | * | 2/1993 | Huard | 365/154 |
| 5,590,087 A | * | 12/1996 | Chung et al. | 365/230.05 |
| 6,469,937 B2 | * | 10/2002 | Fuchigami et al. | 365/185.21 |
| 6,498,757 B2 | * | 12/2002 | Kuo et al. | 365/207 |
| 6,507,523 B2 | * | 1/2003 | Pekny | 365/189.09 |
| 6,717,856 B2 | * | 4/2004 | Srinivasan et al. | 365/185.21 |
| 6,834,024 B2 | * | 12/2004 | Frydel | 365/230.05 |

* cited by examiner

*Primary Examiner*—Son L. Mai
(74) *Attorney, Agent, or Firm*—Rosenberg, Klein & Lee

(57) ABSTRACT

A current-mode sensing structure of a high-density multiple-port register in embedded flash memory procedure and a method for the same are proposed. A multiple-port register file cell is used to send out a select signal of "0" or "1". Based on this select signal, a turn-on voltage and a cell current are output. Next, a dummy bit line of an embedded dummy flash cell is used to define a reference voltage according to the turn-on voltage and generate a corresponding reference current. Finally, the cell current and the reference current are sent to a current comparator amplifier, which senses and outputs a difference value between the cell current and the reference current to perform session at once (SAO) recording. Because the difference value has only two possibilities: the reference current or its negative, the sensing time of the current comparator amplifier can be shortened.

13 Claims, 4 Drawing Sheets

CURRENT-MODE SENSING STRUCTURE OF HIGH-DENSITY MULTIPLE-PORT REGISTER IN EMBEDDED FLASH MEMORY PROCEDURE AND METHOD FOR THE SAME

BACKGROUND OF THE INVENTION

1. Field of the Invention

The present invention relates to a high-density multiple-port register sensing circuit and, more particularly, to a current-mode sensing structure of a high-density multiple-port register in embedded flash memory procedure and a method for the same.

2. Description of Related Art

Generally speaking, the design of multiple-port register predominantly adopts the single-ended voltage sensing scheme. As shown in FIG. 1, a 5-port register file cell 10 has two ports for writing, respectively having bit lines $WBL_1$ and $WBL_2$ and word lines $WWL_1$ and $WWL_2$, and three ports for reading, respectively having bit lines $RDL_1$, $RBL_2$ and $RBL_3$ and word lines $RWL_1$, $RWL_2$ and $RWL_3$. After the bit line $RBL_3$ of the 5-port register file cell inputs a voltage V(bl) to a single-ended voltage-mode sensing amplifier (VSA) 12, the VSA 12 will sense the input voltage and then send it out.

The voltage sensing scheme has the drawbacks of a low speed and a too small dynamic noise margin. The sense voltage input to the voltage sensing scheme needs to be large enough. Moreover, in a high-density register, the larger the load of a bit line, the longer the sensing time, as the following equation shows $$T(\text{sense}) = C(bl) \times V(\text{sense})/I_{cell}$$

where C(bl) is the resistance of a bit line in the multiple-port register, and $I_{cell}$ is the current input from the multiple-port register to the voltage sensing scheme. Because the sense voltage is large, the sensing time is relatively long. Besides, because the voltage sensing scheme is single-ended, the common mode rejection ratio (CMRR) is inferior, causing a larger error.

The present invention aims to propose a current-mode sensing structure of a high-density multiple-port register in embedded flash memory procedure and a method for the same to effectively solve the above problems in the prior art.

SUMMARY OF THE INVENTION

An object of the present invention is to provide a current-mode sensing structure of a high-density multiple-port register in embedded flash memory procedure and a method for the same, in which a dummy flash cell is used to output a reference current for comparison with a current of a multiple-port register file cell to obtain a comparison result of the reference current or its negative, thereby shortening the sensing time of the current comparator amplifier.

Another object of the present invention is to provide a current-mode sensing structure of a high-density multiple-port register in embedded flash memory procedure and a method for the same, in which a dummy bit line is used to perform an erase action or a program action to a reference voltage so as to change a reference current.

Yet another object of the present invention is to provide a current-mode sensing structure of a high-density multiple-port register in embedded flash memory procedure and a method for the same, in which a select signal is input to a multiple-port register file cell to let the cell current of the multiple-port register file cell be 0 or twice the reference current.

Still yet another object of the present invention is to provide a current-mode sensing structure of a high-density multiple-port register in embedded flash memory procedure and a method for the same, in which a dummy flash cell is used to input a current to a current comparator amplifier so as to shorten the sensing time and enlarge the dynamic noise margin.

To achieve the above objects, the present invention provides a current-mode sensing structure of a high-density multiple-port register in embedded flash memory procedure and a method for the same. A multiple-port register file cell is used to send out a select signal of "0" or "1" and output a turn-on voltage and a cell current according to the select signal. An embedded dummy flash cell is used to generate a reference current corresponding to a reference voltage larger than the turn-on voltage defined by a dummy bit line of the dummy flash cell according to the turn-on voltage. Both the cell current and the reference current are sent to a current comparator amplifier, which senses and outputs a difference value between the cell current and the reference current to perform session at once (SAO) recording. The difference value is the reference current or its negative. If the select signal is "1", the cell current is close to 0; if the select signal is "0", the cell current is twice the reference current. Because the difference value has only two possibilities: the reference current or its negative, the sensing time of the current comparator amplifier can be shortened.

BRIEF DESCRIPTION OF THE DRAWINGS

The various objects and advantages of the present invention will be more readily understood from the following detailed description when read in conjunction with the appended drawing, in which.

DETAILED DESCRIPTION OF THE PREFERRED EMBODIMENTS

Figure 1:
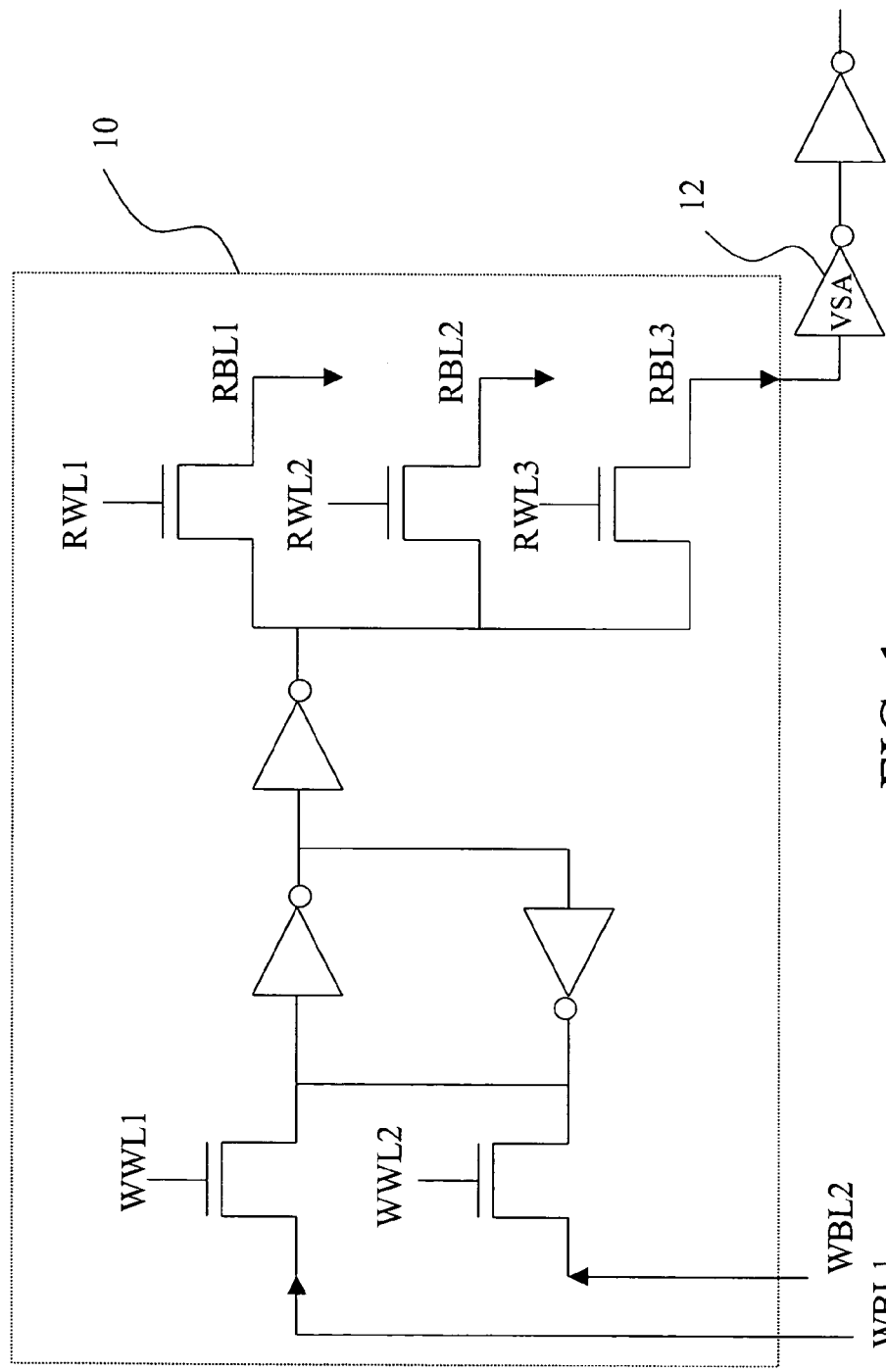
FIG. 1 is a diagram of the single-ended voltage sensing scheme in the prior art.
Figure 2:
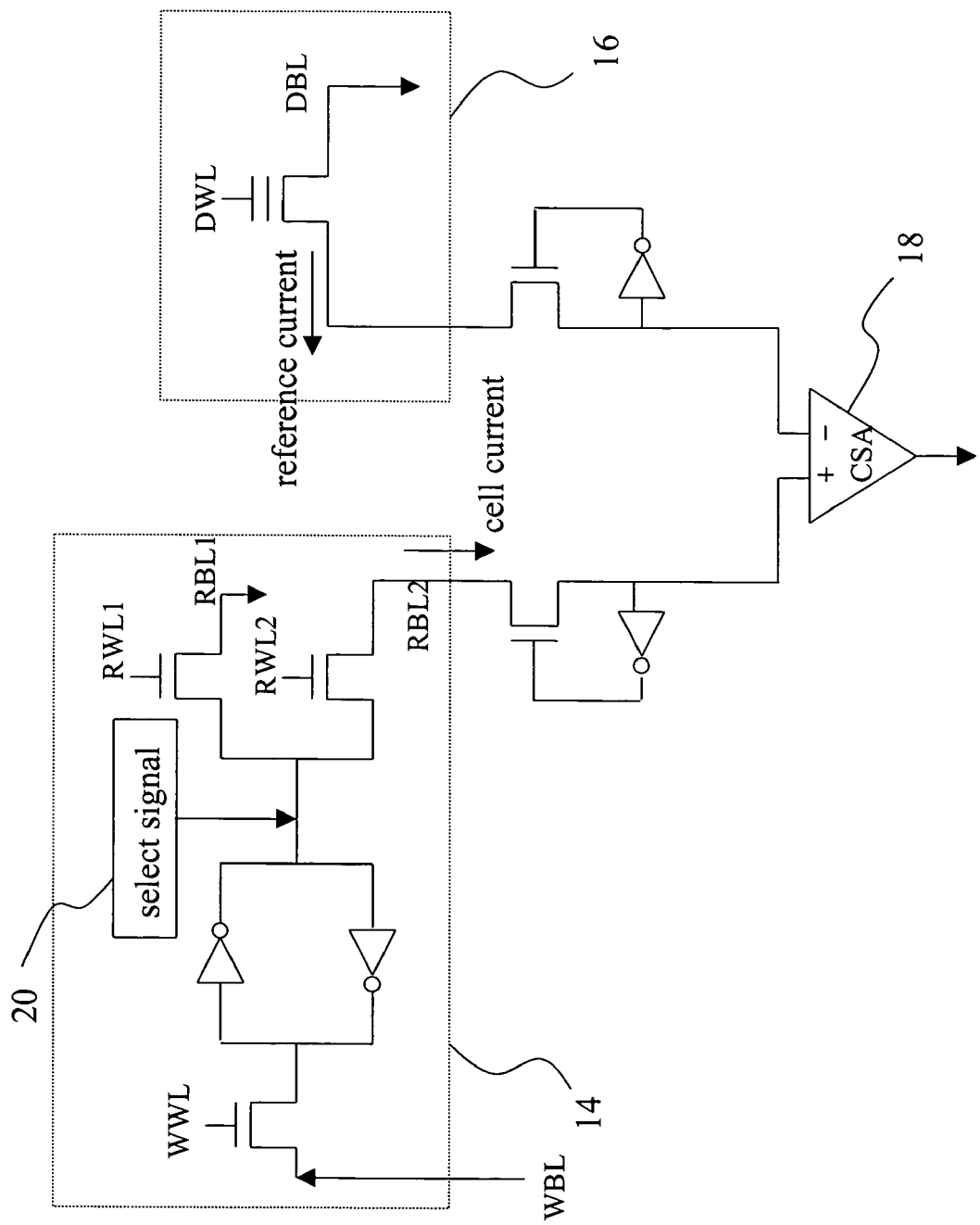
FIG. 2 is a diagram of the architecture of the present invention.

The present invention provides a current-mode sensing structure of a high-density multiple-port register in embedded flash memory procedure and a method for the same. As shown in FIG. 2, the current-mode sensing structure comprises a 3-port register file cell 14, a dummy flash cell 16 and a current comparator amplifier 18. The 3-port register file cell 14 has a port for writing and two ports for reading. The three ports have bit lines WBL, $RBL_1$ and $RBL_2$ and word lines WWL, $RWL_1$ and $RWL_2$, respectively. In front of the reading ports, a select signal 20 is input externally. The 3-port register file cell 14 outputs a turn-on voltage $V_t$ and a cell current $I_{cell}$. The dummy flash cell 16 can have a plurality of gates each connected to a bit line and a word line. In FIG. 2, the dummy flash cell 16 has only a gate. The dummy bit line DBL is connected to the dummy flash cell 16, and defines a reference voltage $V_t'$ for generating a reference current $I_{ref}$. The current comparator amplifier 18 is a current-mode sensing amplifier (CSA), and is set up on a differential circuit.

Figure 3:
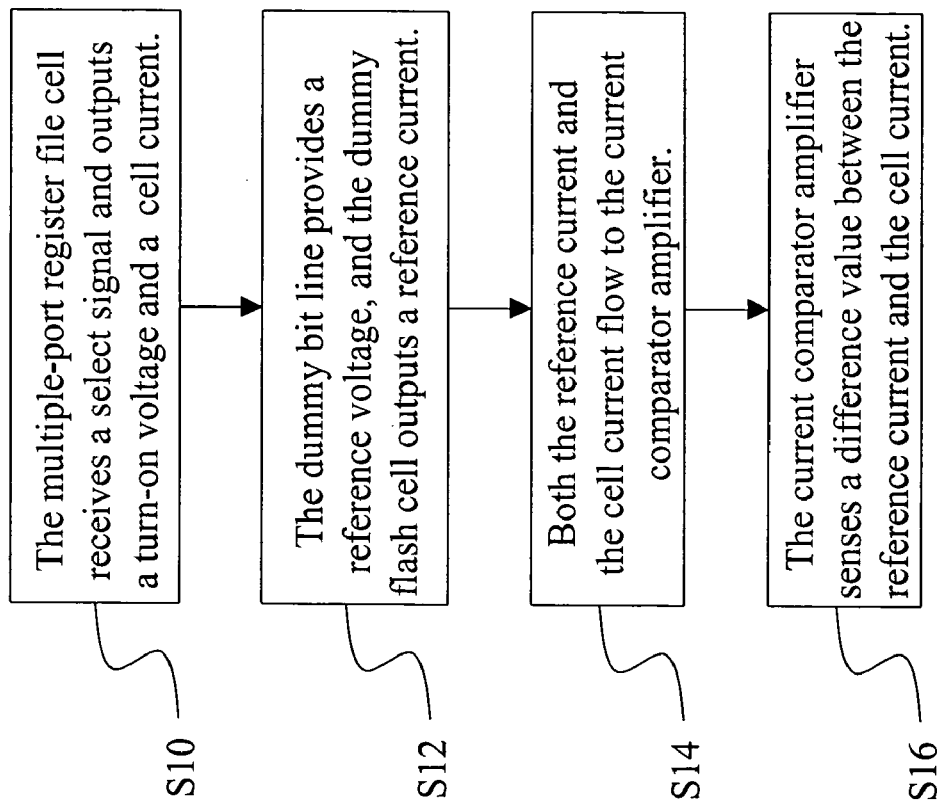
FIG. 3 is a flowchart of the method of the present invention.

FIG. 3 is a flowchart of the method of the present invention. First, a select signal 20 of "0" or "1" is input externally to a 3-port register file cell 14 to let the 3-port register file cell 14 output a turn-on voltage $V_t$ and a cell current $I_{cell}$ according to the select signal 20 (Step S10). Next, the dummy bit line DBL provides a reference voltage, and the dummy flash cell 16 outputs a reference current (Step S12). Because the reference current $I_{ref}$ output by the dummy flash cell 16 is $\frac{1}{2} \times I_{cell}$, the reference current $I_{ref}$ is half the cell current $I_{cell}$. The dummy bit line DBL defines a reference voltage $V_t$'0 according to the turn-on voltage $V_t$ and the cell current $I_{cell}$ output by the 3-port register file cell 14 to let the reference current $I_{ref}$ generated therewith be $I_{cell}/2$. Moreover, the reference voltage $V_t$' is larger than the turn-on voltage. Subsequently, as described by steps S14 to S16, after the dummy flash cell 16 outputs the reference current $I_{ref}$ to the current comparator amplifier 18, the current comparator amplifier 18 will compare these two currents and sense and output a difference value between them to perform session at once (SAO) recording. When the select signal 20 is "0", the cell current $I_{cell}$ is twice the reference current; on the contrary, when the select signal is "1", the cell current $I_{cell}$ is close to 0.

Figure 4:
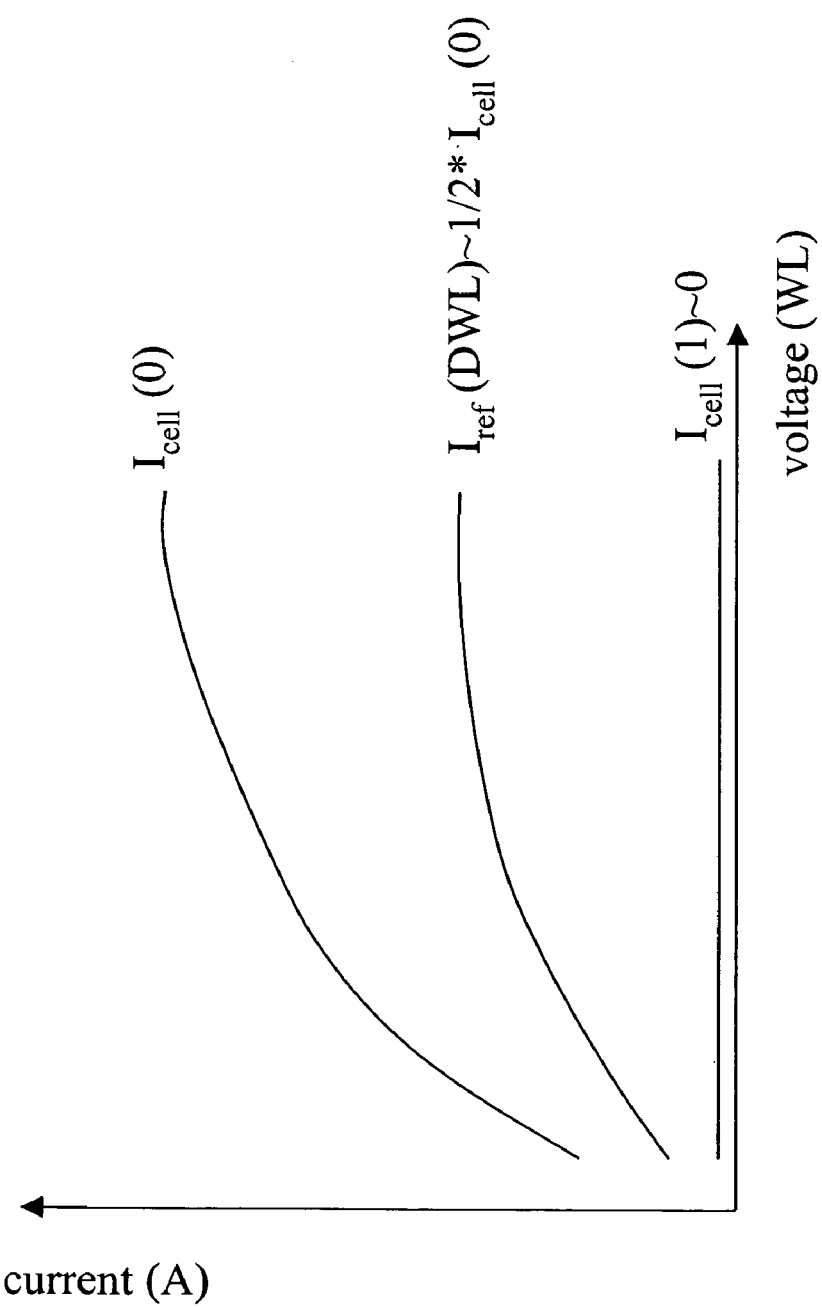
FIG. 4 is a diagram showing the relationships of cell current and reference current relative to voltage in the present invention.

FIG. 4 is a diagram showing the relationships of the cell current provided by the 3-port register file cell and the reference current provided by the dummy flash cell relative to the voltage. As can be seen in this figure, when the select signal is "0", the difference value between these two currents $\Delta I = I_{cell}(0) - I_{ref} \approx 2I_{ref} - I_{ref} = I_{ref}$; when the select signal is "1", the difference value between these two currents $\Delta I = I_{cell}(1) - I_{ref} = -I_{ref}$. Because the difference value has only two possibilities: the reference current $I_{ref}$ or its negative $-I_{ref}$ and the reference current $I_{ref}$ is generated according to the reference voltage defined by the dummy bit line, the sense speed of the current comparator amplifier can be enhanced to greatly shorten the sensing time and also obtain a better dynamic noise margin.

To sum up, the present invention proposes a current-mode sensing structure of a high-density multiple-port register in embedded flash memory procedure and a method for the same, in which a current-mode sensing system is adopted, and a dummy flash cell is used to output a reference current to a differential current comparator amplifier. Because the difference value between the reference current and the cell current is the reference current or its negative and the reference current is generated according to the reference voltage defined by the dummy bit line, the reference current can fully meet the requirements of the present invention and the variation of the reference current that may occur during the procedure can be reduced. Therefore, the current comparator amplifier of the present invention has a shorter sensing time and a better dynamic noise margin as compared to voltage-mode sensing amplifiers used in the prior art.

Although the present invention has been described with reference to the preferred embodiment thereof, it will be understood that the invention is not limited to the details thereof. Various substitutions and modifications have been suggested in the foregoing description, and other will occur to those of ordinary skill in the art. Therefore, all such substitutions and modifications are intended to be embraced within the scope of the invention as defined in the appended claims.

I claim:

1. A current-mode sensing structure of a high-density multiple register in embedded flash memory procedure, said current-mode sensing structure comprising:
   a multiple-port register file cell for sending out a select signal of "0" or "1" and outputting a turn-on voltage and a cell current according to said select signal;
   a dummy flash cell of embedded type for generating and outputting a reference current corresponding to a reference voltage defined by a dummy bit line according to said turn-on voltage; and
   a current comparator amplifier for sensing a difference value between said cell current and said reference current and then outputting said difference value to perform session at once (SAO) recording.

2. The current-mode sensing structure as claimed in claim 1, wherein said current comparator amplifier is set up on a differential circuit.

3. The current-mode sensing structure as claimed in claim 1, wherein the magnitude of said reference current is half that of said cell current.

4. The current-mode sensing structure as claimed in claim 1, wherein said reference voltage is larger than said turn-on voltage.

5. The current-mode sensing structure as claimed in claim 1, wherein said reference voltage can use said dummy bit line to perform an erase or a program action.

6. The current-mode sensing structure as claimed in claim 1, wherein said difference value is said reference current when said select signal is "0".

7. The current-mode sensing structure as claimed in claim 1, wherein said difference value is the negative of said reference current when said select signal is "1".

8. A current-mode sensing method of a high-density multiple register in embedded flash memory procedure, said current-mode sensing method comprising the steps of:
   using a multiple-port register file cell to send out a select signal of "0" or "1" and output a turn-on voltage and a cell current according to said select signal;
   using an embedded dummy flash cell to generate a reference current corresponding to a reference voltage defined by a dummy bit line of said dummy flash cell according to said turn-on voltage; and
   sending said cell current and said reference current to a current comparator amplifier to sense a difference value between said cell current and said reference current and then outputting said difference value to perform session at once (SAO) recording.

9. The current-mode sensing method as claimed in claim 8, wherein the magnitude of said reference current is half that of said cell current.

10. The current-mode sensing method as claimed in claim 8, wherein said reference voltage is larger than said turn-on voltage.

11. The current-mode sensing method as claimed in claim 8, wherein said reference voltage can use said dummy bit line to perform an erase or a program action.

12. The current-mode sensing method as claimed in claim 8, wherein said difference value is said reference current when said select signal is "0".

13. The current-mode sensing method as claimed in claim 8, wherein said difference value is the negative of said reference current when said select signal is "1".

* * * * *